(12) United States Patent
Poechmueller

(10) Patent No.: US 7,349,286 B2
(45) Date of Patent: Mar. 25, 2008

(54) MEMORY COMPONENT AND ADDRESSING OF MEMORY CELLS

(75) Inventor: Peter Poechmueller, Dresden (DE)

(73) Assignee: Infineon Technologies AG, Munich (DE)

( * ) Notice: Subject to any disclaimer, the term of this patent is extended or adjusted under 35 U.S.C. 154(b) by 265 days.

(21) Appl. No.: 11/298,299

(22) Filed: Dec. 9, 2005

(65) Prior Publication Data

US 2006/0152984 A1 Jul. 13, 2006

(30) Foreign Application Priority Data

Dec. 9, 2004 (DE) .................... 10 2004 059 206

(51) Int. Cl.
*G11C 8/00* (2006.01)
(52) U.S. Cl. ................... 365/230.06; 365/200
(58) Field of Classification Search .......... 365/230.06, 365/200
See application file for complete search history.

(56) References Cited

U.S. PATENT DOCUMENTS 5,848,006 A * 12/1998 Nagata .................. 365/230.06
5,886,941 A * 3/1999 Tomita .................. 365/230.06
6,144,612 A * 11/2000 Numasawa ............ 365/230.06
6,243,319 B1 * 6/2001 Yokozeki ............... 365/230.06
2002/0122337 A1 9/2002 Kanazawa et al.

FOREIGN PATENT DOCUMENTS

DE 10127194 A1 12/2002

* cited by examiner

*Primary Examiner*—Anh Phung
(74) *Attorney, Agent, or Firm*—Patterson & Sheridan, L.L.P.

(57) ABSTRACT

A memory component comprises a plurality of memory cells that are each assigned an address, and an address memory for storing numerical values which are uniquely related to addresses of defective memory cells. An address converter having an input for receiving a first address and an output for outputting a second address is designed in such a way that the second address output at its output is dependent on the first address received at its input and on the numerical values stored in the address memory, each first address being uniquely assigned a second address. An address bus, which is connected to the output of the address converter, transfers the second address to an input of an address decoder, which is designed for selecting a memory cell to which the second address is assigned.

20 Claims, 4 Drawing Sheets

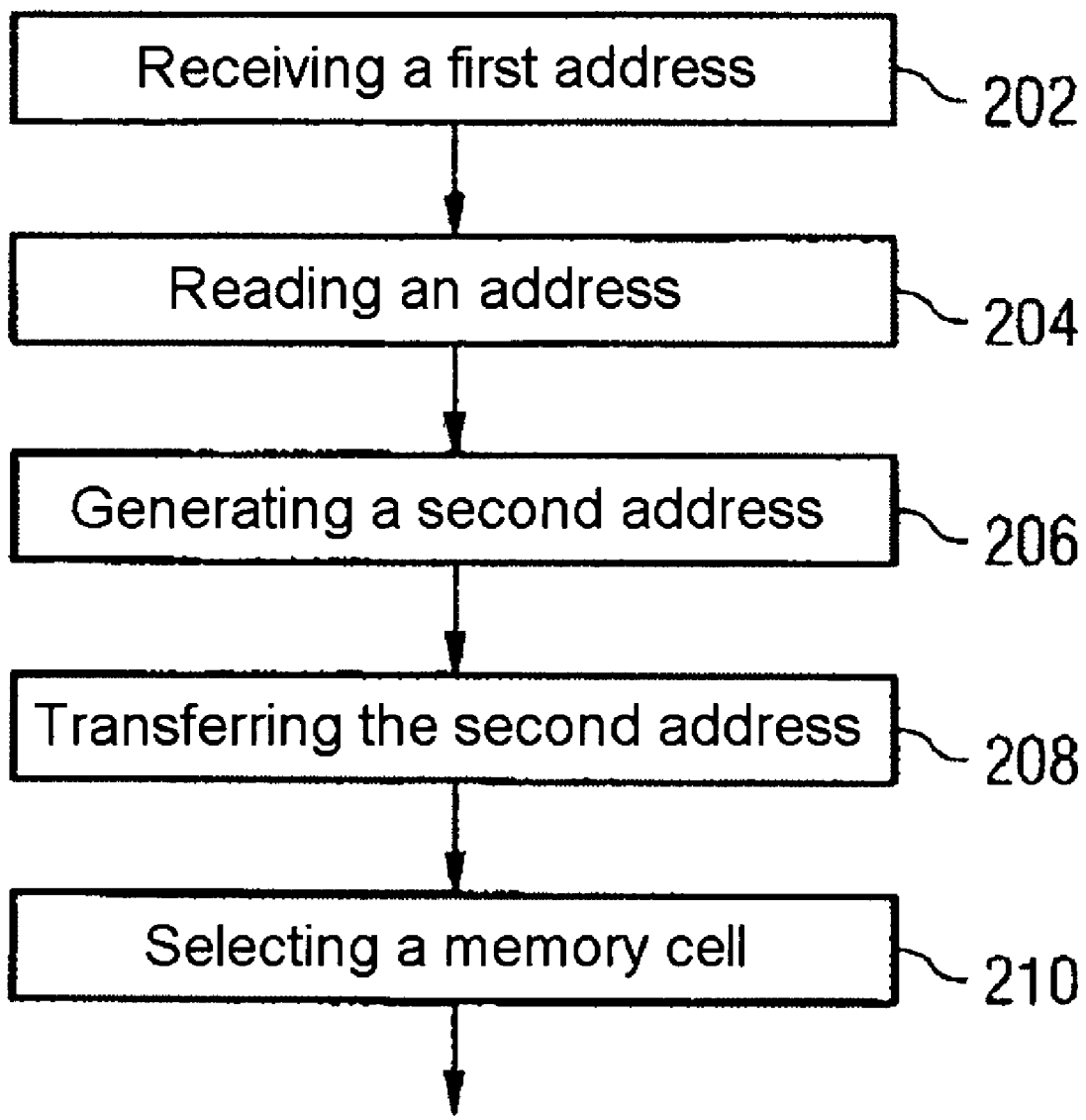

MEMORY COMPONENT AND ADDRESSING OF MEMORY CELLS

CROSS-REFERENCE TO RELATED APPLICATIONS

This application claims foreign priority benefits under 35 U.S.C. §119 to co-pending German patent application number DE 10 2004 059 206.3, filed 9 Dec. 2004. This related patent application is herein incorporated by reference in its entirety.

BACKGROUND OF THE INVENTION

1. Field of the Invention

The present invention relates to a memory component and the addressing of memory cells therein for the replacement of defective memory cells.

2. Description of the Related Art

The miniaturization of integrated semiconductor circuits and in particular of memory components is increasingly reaching physical and economic limits. Every further reduction of the dimensions of memory cells necessitates a very high technological outlay, for example for introducing dielectrics having a high dielectric constant or permittivity for the storage capacitors. It is already customary for the introduction of a new dynamic random access memory (DRAM) shrink (i.e., reduction of the linear dimensions) to necessitate an increase in the technological costs by 10% to 15%. This offsets a large proportion of the cost advantages resulting from the shrink, which are typically 20% to 30%.

The reason for the increase in the technological costs for every shrink or from generation to generation is that the capacity of the individual memory cell is typically kept essentially constant from generation to generation. As a result, on an individual DRAM memory chip, on average statistically there are always 50 to 100 individual memory cells to be repaired owing to a defect, by said memory cells being replaced by redundant memory cells. However, it is becoming increasingly difficult to keep constant this number of defective memory cells to be repaired per DRAM memory component.

Therefore, a paradigm shift is proposed. By providing massive redundancy, that is to say, a substantially higher number of redundant memory cells in comparison with conventional memory components, the requirements made of the individual memory cell can be greatly reduced. This in turn permits a reduction of the electrostatic capacitance of the individual storage capacitor, for example, by 50% or more. Massive redundancy requires an additional chip area. However, this additional chip area generates lower fabrication costs than the high technological outlay described above.

However, the conventional repair of defective or weak memory cells is not suitable for a very high number of defective memory cells and corresponding massive redundancy. A memory component is conventionally organized in memory blocks. Each memory block has a regular region with regular memory cells and a redundant region with redundant memory cells. Defective regular memory cells of a memory block are replaced by redundant memory cells of the same memory block.

In this case, it inevitably happens that individual memory blocks have only very few defective memory cells, with the result that the redundancy present is also only partly utilized. At the same time, other memory blocks may, under certain circumstances, have so many defective memory cells that they can no longer be completely replaced by the redundancy present. If each memory block is provided with so much redundancy that all defective memory cells can be repaired with a predetermined high probability, superfluous redundancy is inevitably present in many memory blocks. This means a waste of chip area and hence unnecessarily high fabrication costs.

Normally, each memory block is assigned two word line address decoders. A first address decoder activates the assigned word line depending on a word line address. A second decoder is connected to an address memory or has an address memory in which the word line addresses of defective memory cells are stored. If the second decoder receives a word line address which is also stored in the address memory, it deactivates the first decoder and activates a redundant word line whose address is assigned to the word line address of the defective memory cell.

Each memory block conventionally has only a small number of redundant word lines. The address memory is correspondingly small. However, the concept described cannot readily be applied to a memory component which comprises a significantly larger number of redundant memory cells and redundant word lines in each memory block. In particular, arranging a large address memory in direct proximity to each memory block is problematic.

SUMMARY OF THE INVENTION

The object of the present invention is to provide a memory component and a method for selecting a memory cell which are suitable even for massive redundancy.

The present invention is based on the idea of no longer distinguishing between regular and redundant memory cells, word lines or memory regions, but rather assigning all memory cells to the same address decoder or to identically or similarly constructed address decoders. Defective memory cells are instead replaced by other, functional addresses by conversion of a first address into a second address.

In accordance with the present invention, an address converter receives a first address having an arbitrary value within a predetermined first address space. The address converter maps said first address onto a second address within a predetermined second address space. Each second address is assigned to precisely one or a group of memory cells of which a statistical proportion are defective. The mapping or conversion takes place in this case such that no first address is mapped onto a second address to which a defective memory cell is assigned. The second address is transferred via an address bus to one or more address decoders. The address decoder or address decoders selects or select a memory cell assigned to the second address in order to enable a writing or reading operation or a refresh of the memory cell.

One advantage provided by the present invention is that regular and redundant memory cells are no longer differentiated with regard to the hardware of the memory component, which results in maximum flexibility in the replacement of defective memory cells. The address converter according to the invention is preferably assigned to a multiplicity of memory blocks or to a memory region which overall is as large as possible with as many memory cells as possible. Within this memory region, defective memory cells can be replaced by functional memory cells according to different concepts that are described in greater detail in the exemplary embodiments. In accordance with the present invention, local clusters of defective memory cells, for example, in individual memory blocks, can readily be repaired by replacement by functional memory cells as long as the total number of defective memory cells in the memory region assigned to the address converter does not exceed a maximum limit. As a result, it is possible overall to provide lower redundancy than that which is conventional and nevertheless to be able to repair all defective memory cells with the same probability.

A further advantage provided by the present invention is that the address converter with an address memory in which are stored numerical values which are uniquely related to the addresses of defective memory cells can be arranged arbitrarily on the memory component. Only (second) addresses which address exclusively functional memory cells are transferred via the address bus between the address converter and the address decoder or address decoders. The address decoder or address decoders therefore need no longer have address memories in which the addresses of defective memory cells are stored. Since the address converter with the address memory can be arranged virtually arbitrarily, this results in great freedom in the design of the memory component. In particular, the address memory, which may comprise of fuses for example, may be arranged far away from the individual memory blocks or even on a chip rear side or another chip.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7 shows a schematic flow diagram of a method in accordance with the present invention.

DETAILED DESCRIPTION OF THE PREFERRED EMBODIMENT

Figure 1:
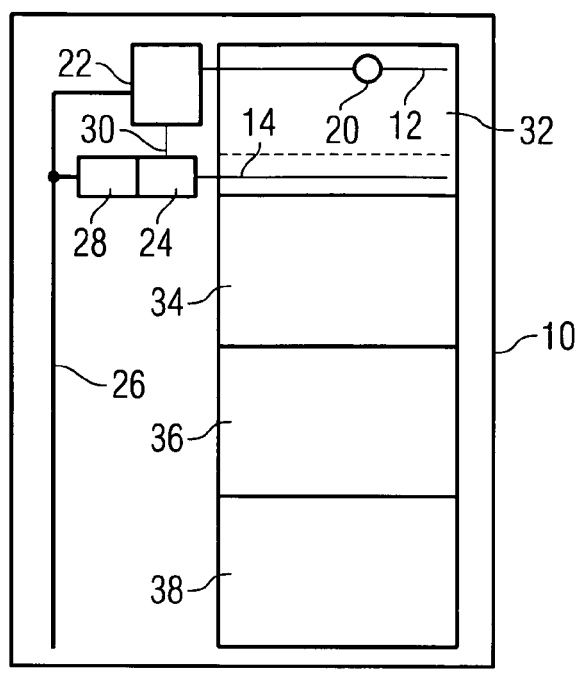
FIG. 1 shows a schematic circuit diagram of a conventional memory component.

FIG. 1 is a schematic circuit diagram illustrating a conventional memory component 10 and some of its components. The memory component 10 comprises a plurality of memory cells 20 which are arranged in a plurality of memory blocks 32, 34, 36, 38 in each case in an array. Each memory block comprises a plurality of regular word lines 12 and a plurality of redundant word lines 14 on which the memory cells 20 are arranged. All the regular word lines 12 of a memory block 32, 34, 36, 38 are connected to an address decoder 22 assigned to the memory block, which address decoder is also referred to hereinafter as a regular address decoder. All the redundant word lines 14 of a memory block 32, 34, 36, 38 are connected to a further address decoder 24 assigned to the memory block 32, 34, 36, 38, which further address decoder is also referred to hereinafter as a redundant address decoder. Part of the redundant address decoder 24 or connected thereto is an address memory 28, in which addresses of defective memory cells 20 are stored. The regular address decoder 22 and the redundant address decoder 24 are connected to an address bus 26, via which they receive addresses.

With the purpose of clarity in the illustration, FIG. 1 illustrates only in each case one memory cell 20, one regular word line 12, one redundant word line 14, only a small number of memory blocks 32, 34, 36, 38 and the address decoders 22, 24 and also the address memory 28 only for a single memory block 32. Further components of the memory component 10, for example, bit lines, sense amplifiers, bit line address decoders, multiplexers, demultiplexers, input and output amplifiers and buffers, are likewise not illustrated in FIG. 1 since they are not relevantly related to the addressing of the memory cells in this example.

Prior to a write or read access to a memory cell or prior to a refresh of a memory cell, a word line address is transferred via the address bus 26. The regular address decoder 22 thereupon activates the word line 12 corresponding to the address unless it is deactivated as below by the redundant address decoder 24. If the address transferred via the address decoder 26 corresponds to an address stored in the address memory 28, the redundant address decoder 24 deactivates the regular address decoder 22 and activates a redundant word line 14 assigned to the address in the address memory 28.

Figure 2:
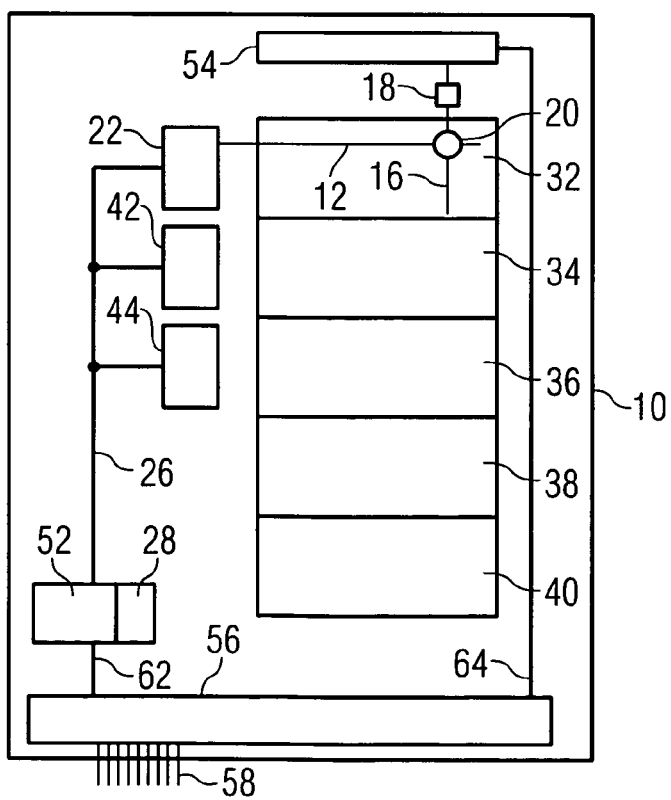
FIG. 2 shows a schematic circuit diagram of a memory component in accordance with one exemplary embodiment of the present invention.

FIG. 2 is a schematic circuit diagram of a memory component 110 in accordance with one exemplary embodiment of the present invention. The memory component 10 comprises a plurality of memory blocks 32, 34, 36, 38, 40, in each of which an array of memory cells 20 is arranged. Each memory block comprises a plurality of word lines 12 and a plurality of bit lines 16. Each memory cell 20 is arranged at the crossover of a word line 12 and a bit line 16. Each bit line 16 is connected to a sense amplifier 18.

All the word lines 12 of a memory block 32, 34, 36, 38, 40 are connected to an address decoder 22, 42, 44 assigned to the memory block. All the sense amplifiers 18 of a memory block 32, 34, 36, 38, 40 are connected to a first device 54.

A second device 56 is connected to the first device 54 and, via a first address bus 62, to an address converter 52. The address converter 52 comprises an address memory 28 or is connected to an address memory 28. The address decoders 22, 42, 44 are connected to the address converter 52 via a second address bus 26. The first device 54 and the second device 56 schematically represent bit line address decoders, amplifiers, multiplexers, demultiplexers, buffers, input and output amplifiers, etc. The second device 56 is connected to inputs and outputs 58 of the memory component 10.

With the purpose of clarity of the illustration, FIG. 2 shows only in each case one or a small number of word lines 12, bit lines 16, memory cells 20, address decoders 22, 42, 44 and memory blocks 32, 34, 36, 38, 40. However, the present invention can be applied to memory components having an arbitrary number of memory blocks 32, 34, 36, 38, 40 which are in each case assigned an arbitrary number of word lines 12, an arbitrary number of bit lines 16, an arbitrary number of memory cells 20 and one or more address decoders 22, 42, 44. Furthermore, the memory component may comprise a plurality of address converters which are connected to address decoders of different memory blocks via a respective address bus.

Prior to a write or read access to one or more memory cells or at the beginning of such an access or for refreshing one or more memory cells 20, the second device 56 communicates a first word line address to the address converter 52 via a first address bus 62. The address converter 52 generates a second word line address in a manner that is described in greater detail further below with reference to FIGS. 3, 4 and 5. Said second address is a function of the first address and the numerical values which are uniquely related to the addresses of defective memory cells and are stored in the address memory 28.

The second address is transferred to the address decoders 22, 42, 44 via the second address bus 26. Depending on the second address, the address decoders 22, 42, 44 activate one or more word lines 12 assigned to the address. Preferably, in this case the number of word lines 12 that are activated in each memory block 32, 34, 36, 38, 40 is only in each case such that each bit line 16 is connected to at most one memory cell 20.

The address converter 52 converts the first address into the second address such that the second address addresses exclusively word lines which are assigned exclusively defect-free memory cells 20. By way of example, the first address may assume 1024 different values in the range between 0 and 1023, which can be represented by ten bits. The second address may for example assume 1280 different values in the address range from 0 to 1279. Eleven bits are then required for representing the second address.

If, among the 1280 word lines 12 that can be addressed by the second address, at most 256 word lines are assigned one or more defective memory cells and conversely at least 1024 word lines are assigned exclusively defect-free memory cells 20, each value of the first address can be converted one-to-one into a value of the second address such that no defective memory cells or word lines to which defective memory cells are assigned are addressed. The address converter 52 and its function are explained in greater detail below with reference to FIGS. 3 to 6.

Figure 3:
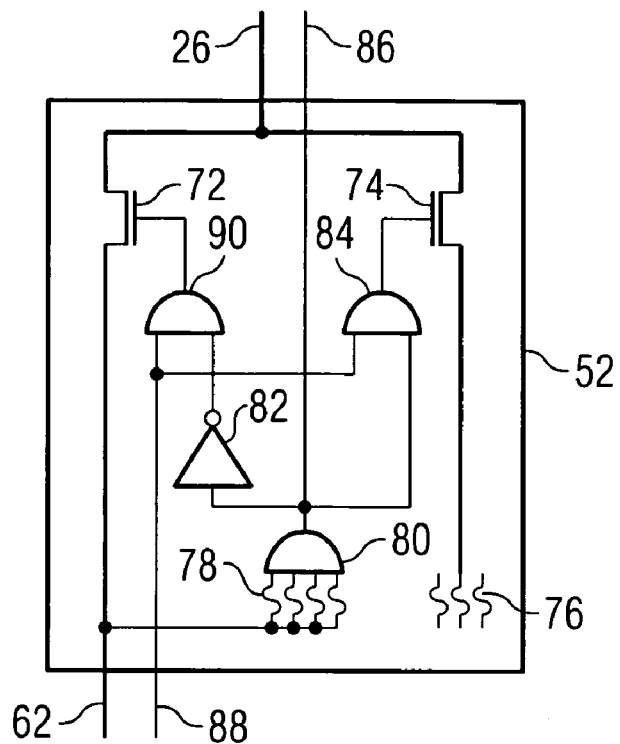
FIG. 3 shows a schematic circuit diagram of an address converter in accordance with one exemplary embodiment of the present invention.

FIG. 3 is a schematic circuit diagram of a first exemplary embodiment of the address converter 52 of a memory component 110 according to the invention such as has been illustrated above, for example, with reference to FIG. 2. The address converter 52 comprises a first switch 72 for connecting the first address bus 62 to the second address bus 26. If the bits of the first and second addresses are in each case transferred in parallel via a corresponding number of individual lines of the address buses 62, 26, the first switch 72 comprises a corresponding number of individual switches which respectively connect a line of the first address bus 62 to a line of the second address bus 26.

Furthermore, the address converter 52 comprises a switch 74 for applying an address stored in a first set of fuses 76 to the second address bus 26. If the second address bus 26 is a parallel address bus, the second switch 74 once again comprises a corresponding number of individual switches by means of which a bit represented by a fuse or the state thereof can in each case be applied to a line of the second address bus 26.

The address converter 52 furthermore comprises a second set of fuses 78 and a first AND gate 80, at the inputs of which the bits of an address transferred via the first address bus 62 are compared with the bits stored in the second set of fuses 78. The output of the first AND gate 80 is connected to the input of an inverter 82, to a redundancy signal line 86 and to a first input of a second AND gate 84. The output of the inverter 82 is connected to a first input of a third AND gate 90. A control signal input 88 of the address converter 52 for receiving a valid signal is connected to the second inputs of the second and third AND gates 84, 90. The output of the second AND gate 84 controls the second switch 74. The output of the third AND gate 90 controls the first switch 72.

If the address converter 52 receives via the first address bus 62 a first address that does not correspond to the address stored in the second set of fuses 78, a logic zero is present at the output of the first AND gate. If the address converter simultaneously receives a valid signal via the control signal input 88, the first switch 72 is closed and the second switch 74 is opened under the control of the second AND gate 84 and the third AND gate 90. As a result, the first address received via the first address bus 62 is output unchanged as second address via the second address bus 26.

If the address converter 52 receives via the first address bus 62 a first address which corresponds to the address stored in the second set of fuses 78, a logic one is present at the output of the first AND gate 80. If the address converter 52 simultaneously receives a valid signal via the control signal input 88, the second switch 74 closes under the control of the second AND gate 84, while the first switch 72 is opened under the control of the third AND gate 90. As a result, an address stored in the first set of fuses 76 is applied to the second address bus 26.

In a departure from the simplified illustration in FIG. 3, an address converter 52 preferably comprises a plurality of second switches 74, a corresponding plurality of first sets of fuses 76, a corresponding plurality of second sets of fuses 78, a corresponding plurality of first AND gates 80 and a corresponding plurality of second AND gates 84. In this case, a first set of fuses 76, a second set of fuses 78, a first AND gate 80, a second AND gate 84 and a second switch 74 are in each case interconnected in the manner illustrated in FIG. 3. All the switches 74 are connected in parallel with the second address bus 26, and the second inputs of all the second AND gates 84 are connected in parallel with the control signal input 88. At the inputs of each first AND gate 80, the first address received via the first address bus 62 and the address stored in the assigned second set of fuses 78 are compared with one another, and the outputs of all the first AND gates 80 are connected to a respective input of an OR gate (not illustrated), the output of which is connected to the input of the inverter 82 and the redundancy signal line 86.

Each second set of fuses 78 stores an address which, if it is present at the first address bus 62, is replaced—by the address converter 52—by the second address stored in the assigned first set of fuses 76.

In the case of the above numerical example, the address converter 52 comprises 256 first sets each of eleven fuses 76 and 256 second sets each of ten fuses 78. However, since all the addresses stored in the first sets of fuses 76 lie in the space 1024 to 1279, the three most significant bits of these addresses, that is to say the three bits having the values 1024, 512 and 256, always have the states one-zero-zero. The corresponding fuses 76 of the first sets can therefore be replaced by hardwired arrangements.

As an alternative, the redundancy signal transferred via the redundancy signal line 86 is used as the most significant bit, the address decoders 22, 42, 44 connected downstream being designed such that they ignore the next two bits having the values 512 and 256 and set them to zero if the most significant bit or the redundancy signal transferred via the redundancy signal line 86 has the state one. In this case, each first set of fuses 76 only has to comprise eight fuses, and each switch 72, 74 only has to comprise eight individual switches which switch the least significant bits.

Figure 4:
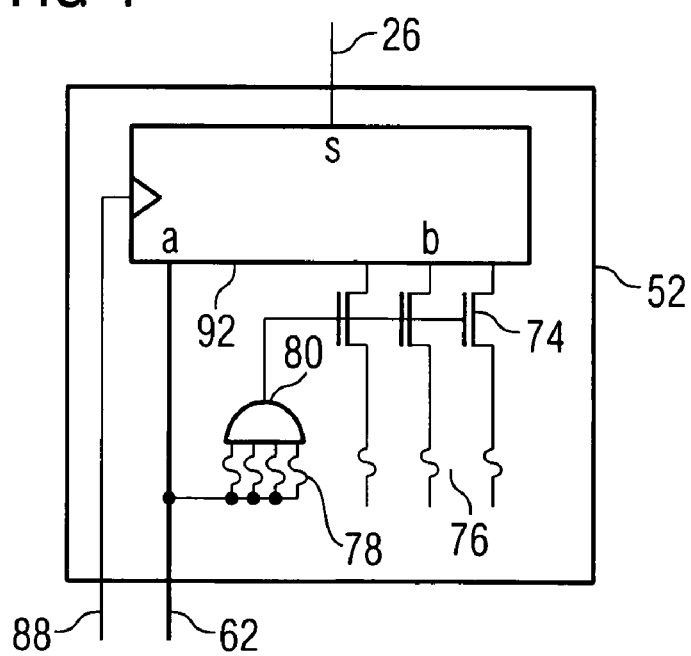
FIG. 4 shows a schematic circuit diagram of an address converter in accordance with a further exemplary embodiment of the present invention.

FIG. 4 is a schematic circuit diagram of a further exemplary embodiment of the address converter 52 of a memory component 110 according to the invention. This exemplary embodiment differs from that illustrated above with reference to FIG. 3 by virtue of the fact that the second address is generated from the first by addition of an address shift value rather than by partial or complete replacement of bits. For this purpose, the address converter 52 has an adder 92, the first input "a" of which is connected to the first address bus 62 in order to receive the first address, and the second input "b" of which is connected via switches 74 to a first set of fuses 76, in which an address shift value is stored. The switches 74 are controlled by the output of an AND gate 80, at the inputs of which, as in the case of the exemplary embodiment above, the bits of the first address received via the first address bus are compared with second addresses stored in sets of second fuses 78. At its output S, which is connected to the second address bus 26, the adder 92 generates the sum of the first address received at the input "a" from the first address bus 62 and the address shift value present at the second input "b" if a control signal is present at a control signal input 88.

In a departure from the simplifying illustration in FIG. 4, the address converter 52 preferably has in each case a plurality of first sets of fuses 76, second sets of fuses 78, AND gates 80 and switches 74. Each second set of fuses 78 stores a first address that is to be replaced by another, second address.

If the address converter 52 receives on the first address bus 62 a first address which corresponds to an address stored in one of the second sets of fuses 78, the switches 74 assigned to the second set of fuses 78 close under the control of the AND gate 80 assigned to the second set of fuses 78, so that an address shift value stored in a first set of fuses 76 assigned to the second set of fuses 78 is present at the second input "b" of the adder 92.

If a first address present at the first input a of the adder 92 via the first address bus 62 is not stored in any of the second sets of fuses 78, the adder 92 adds the value 0 to the first address, so that the second address output to the second address bus 26 at the output S corresponds to the first address. For this purpose, the second input "b" of the adder 92 or a circuit that is not illustrated in FIG. 4 between the latter and the switches 74 is designed such that the second input "b" is precharged to the value 0 if all the switches 74 are open.

In the simplest case of the numerical example already mentioned above with 1024 first addresses, each second set comprises ten fuses 78. In order to be able to convert each first address in the address space 0 to 1023 in the address space 1024 to 1279, address shift values of between 1 and 1024 are required. In order to be able to store these 1024 possible different address shift values, each first set must comprise at least ten fuses 76. In order to manage with this minimal number of fuses 76, a logic that is not illustrated in FIG. 4 is required which shifts the numbers 0 to 1023 that are naturally represented by the fuses 76 into the range of the address shift values (1 to 1024) through the addition of the value 1.

Consequently, in the case of this example with 1024 first and 1280 second addresses, 256 first sets each of ten fuses 76 and 256 second sets each of ten fuses 78 (and also 256 AND gates 80 and 256 sets each of ten switches 74) are required.

In this case as well, however, in a similar manner to in the first exemplary embodiment illustrated above with reference to FIG. 3, it is possible to alter only the eight bits having the lowest values. For this purpose, only eight fuses 76 are then required per first set. In this case, the adder 92 is preferably designed such that it always sets the two most significant bits (having the values 512 and 256) at the output S to 0 and adds an additional eleventh bit (having the value 1024) with the state 1 if there is present at the output of an AND gate 80 a logic one indicating that the first address received on the first address bus 62 corresponds to a second address stored in one of the second sets of fuses 78. For this purpose, the adder 92 requires an additional input connected (via an OR gate) to the outputs of the AND gates 80.

As an alternative, this manipulation of the three most significant bits is effected in a device that is not illustrated in FIG. 4 between the output S of the adder 92 and the second address bus 26.

In accordance with a further alternative, the adder 92 is designed such that it always sets the two most significant bits (having the values 512 and 256) at the output S to 0 and adds an additional eleventh bit (having the value 1024) with the state 1 if an address shift value that is greater than zero is present at its second input b. This indicates that the first address received on the first address bus 62 corresponds to a second address stored in one of the second sets of fuses 78.

In accordance with a further alternative, in a similar manner to in the exemplary embodiment illustrated above with reference to FIG. 3, the value of the output of the AND gate 80 or of an ORing of the outputs of all the AND gates 80 is transferred as a redundancy signal to all the address decoders 22, 42, 44. The described treatment of the three most significant bits is then effected in the address decoders 22, 42, 44.

In the exemplary embodiments of the address converter 52 that are illustrated above with reference to FIGS. 3 and 4, all the fuses 76, 78 together form the address memory 28 which is illustrated in FIG. 2 and in which the addresses of defective memory cells are stored in fuses 78. By means of the first sets of fuses 76, each address of a defective memory cell is assigned another address.

Figure 5:
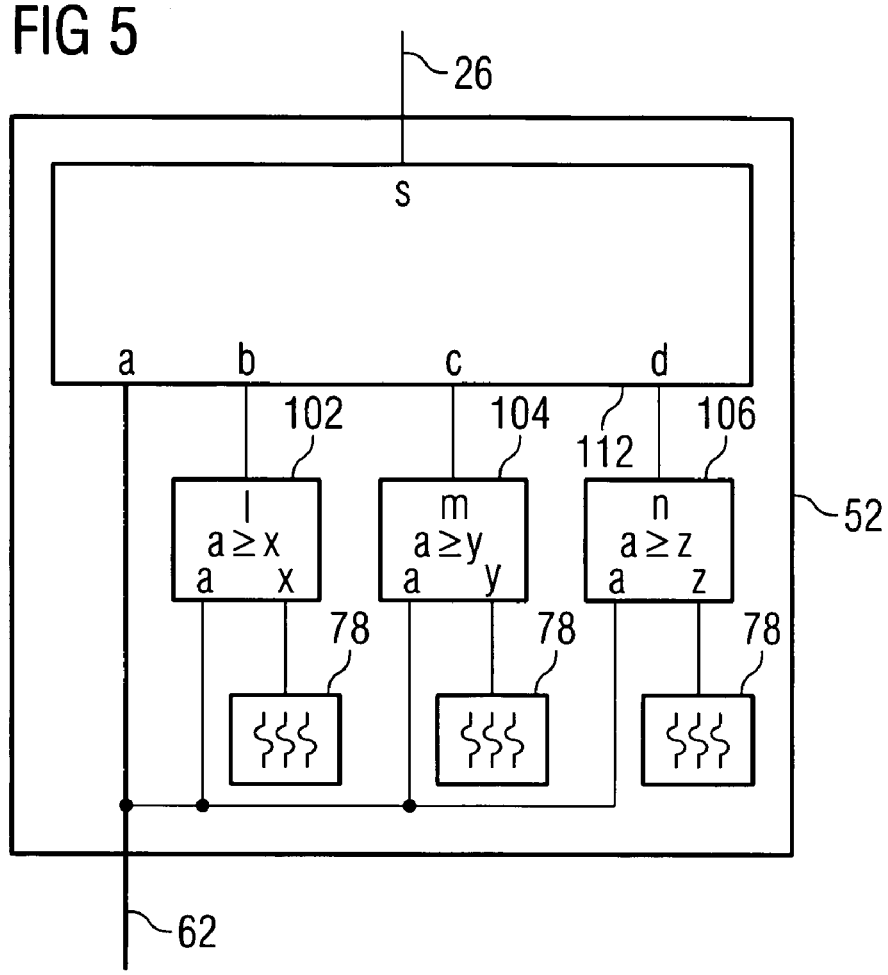
FIG. 5 shows a schematic circuit diagram of an address converter in accordance with a further exemplary embodiment of the present invention.

FIG. 5 is a schematic circuit diagram of a further exemplary embodiment of the address converter 52 of a memory component 110 according to the invention. The address converter 52 comprises a plurality of sets of fuses 78 for storing a respective numerical value. Each set of fuses 78 is connected to an input x, y, z of a digital comparator 102, 104, 106. A further input a of each comparator 102, 104, 106 is connected to the first address bus 62. Each comparator 102, 104, 106 generates at its output l, m, n a Boolean signal which has the value 1 precisely when a value greater than at the first input x, y, z is present at the second input a.

The first address bus 62 and also the outputs l, m, n of the comparators 102, 104, 106 are connected to a respective input a, b, c, d of an adder 112. The output S of the adder 112 is connected to the second address bus 26. The adder 112 outputs at its output S the sum of the values which are present at its inputs a, b, c, d.

The sets of fuses 78 store numerical values which are uniquely related—in a manner described in greater detail further below—to addresses of defective memory cells, in particular to word line addresses to which defective memory cells are assigned. Each individual comparator 102, 104, 106 generates an output signal indicating whether a first address received via the first address bus 62 is greater than or equal to the numerical value stored in the assigned set of fuses 78. The adder 112 adds to the first address the number of those numerical values stored in the sets of fuses 78 which are less than the first address.

The function of the exemplary embodiment of the address converter 52 that is illustrated in FIG. 5 is explained in more detail below with reference to FIG. 6.

Figure 6:
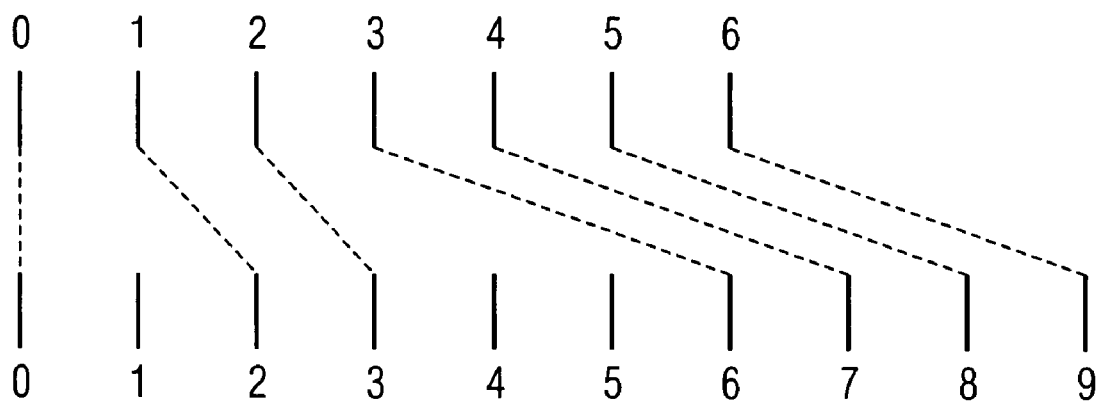
FIG. 6 shows a schematic illustration of the address conversion in the address converter from FIG. 5.

FIG. 6 schematically shows a number of first addresses having the values 0 to 6, illustrated in an upper row, and a number of second addresses having the values 0 to 9, illustrated in a lower row. The assignment of second addresses to first addresses is illustrated by dashed lines that in each case connect a first address and a second address to one another. It is assumed in the example that defective memory cells are assigned to the word lines having the addresses 1, 4 and 5. Therefore, by way of example, the number one is stored in the set of fuses 78 which is assigned to the first comparator 102, while the number three is stored in both the other sets of fuses 78. In this case, it clearly emerges from the circuit diagram in FIG. 5 that, on account of the symmetry of the circuit, it is unimportant what number is stored in what set of fuses 78.

If the address converter 52 illustrated in FIG. 5 receives the address 0 via the first address bus 62, this address is less than all the numerical values stored in the sets of fuses 78. Consequently, all the comparators 102, 104, 106 generate the value zero at their outputs, and the second address that is generated by the adder 112 and output via the second address bus 26 corresponds to the first address.

If the first address received via the first address bus 62 has the value 1 or 2, precisely one comparator 102, 104, 106, to be precise the one whose assigned set of fuses 78 stores the number one, generates a logic one at its output. The second address generated at the output S by the adder 112 is therefore greater than the first address by 1.

If the address received via the first address bus 62 has the value 3, 4, 5 or 6, this address is greater than or equal to all the numerical values stored in the sets of fuses 78. Therefore, all three comparators 102, 104, 106 generate a logic one in each case at their output. The adder 112 therefore generates from the first address a second address which is greater than the first address by 3.

It is evident that although the numerical values stored in the sets of fuses 78 are uniquely related—down to permutation—to the addresses of those word lines to which defective memory cells are assigned, they are not identical to these. The addresses of defective memory cells result from the numerical values stored in the sets of fuses 78 in that each numerical value stored in one set of fuses 78 has to have added to it the number of those addresses which are smaller and are stored in other sets of fuses 78. If the same numerical value is stored in a plurality of sets of fuses 78, identical addresses initially result in this way. The number 1 then has to be added to the second identical address, the number 2 has to be added to the third identical address, etc.

A simple mapping specification between the numerical values stored in the sets of fuses 78 and the addresses of defective memory cells is attained by the numerical values stored in the sets of fuses 78 being sorted in numerically ascending fashion and being numbered with non-negative integers beginning with the number 0. An address of a defective memory cell is then obtained from a numerical value stored in a set of fuses 78 by adding the number of the numerical value.

Conversely, the numerical values stored in the sets of fuses 78 are obtained from the addresses of defective memory cells by the addresses firstly being sorted in numerically ascending fashion and being numbered in ascending fashion with non-negative integers beginning with the number 0. A numerical value to be stored in one of the sets of fuses 78 is then obtained from an address of a defective memory cell by subtracting its number from the address.

In the case of the numerical example with 1024 first and 1280 second addresses already mentioned repeatedly above, the address converter 52 illustrated in FIG. 5 comprises 256 comparators 102, 104, 106 and 256 sets each of ten fuses 78. One advantage of the exemplary embodiment of the address converter 52 as described with reference to FIG. 5 is that it contains significantly fewer fuses 78 than the exemplary embodiments illustrated above with reference to FIGS. 3 and 4. Although this is opposed by a certain area requirement of the logic, in particular of the comparators 102, 104, 106 and of the adder 112, said area requirement is comparatively of increasingly less importance on account of the advancing miniaturization and the area requirement of each individual fuse which essentially remains constant.

In a departure from the exemplary embodiment illustrated in FIG. 5, instead of the one adder 112, it is also possible for a plurality of adders to be provided, for example, one adder adding the outputs of the comparators 102, 104, 106, and the output of this adder being added to the first address by a further adder in order to obtain the second address. Furthermore, simplifications are possible which are based, for example, on the fact that the numerical values can be stored in numerically sorted fashion in the sets of fuses 78.

It is evident that all the exemplary embodiments illustrated above with reference to FIGS. 3 to 6 can be implemented not just for the numerical example that has been mentioned repeatedly, but for arbitrary address spaces of the first and second addresses.

In the above exemplary embodiments, the address converter 52 converts the word line addresses in order to replace defective memory cells by other, functional memory cells. However, as an alternative or in addition, the present invention can also be applied to a corresponding conversion of bit line addresses in order to replace bit lines to which defective memory cells are assigned by other bit lines. Furthermore, the present invention can also be applied to all further addresses that are neither word line addresses nor bit line addresses.

FIG. 7 is a schematic flow diagram illustrating a method in accordance with a preferred exemplary embodiment of the present invention as is preferably implemented in a memory component according to the invention. Although the method can also be implemented independently of the memory component, it is therefore described below with reference to the memory component 110 according to the invention as described above.

In a first step 202, the address converter 52 receives a first address. In a second step 204, the address converter 52 reads numerical values from an address memory, in which are stored numerical values which are uniquely related to addresses of defective memory cells. In a third step 206, the address converter 52 generates a second address, depending on the first address and the numerical values read from the address memory. The relationship between the first address, the second address and the numerical values stored in the address memory is such that each first address is uniquely assigned a second address, each second address is assigned at most one first address, and no defective memory cells are addressed by the second addresses. In a fourth step 208, the second address is transferred via the second address bus 26 to an address decoder 22, 42, 44, which selects a memory cell depending on said second address.

In both the memory component and the method as described above with reference to the figures, the memory blocks 32, 34, 36, 38 are preferably congeneric, i.e., the memory blocks 32, 34, 36, 38 are of the same kind. For example, all of the memory blocks are RAM blocks (in particular DRAM blocks) or all of the memory blocks are EEPROM memory blocks.

While the foregoing is directed to embodiments of the present invention, other and further embodiments of the invention may be devised without departing from the basic scope thereof, and the scope thereof is determined by the claims that follow.

What is claimed is:

1. A memory component, comprising:
    a plurality of memory cells, each memory cell assigned an address;
    an address memory for storing numerical values which are uniquely related to addresses of defective memory cells;
    an address converter having an input for receiving a first address and an output for outputting a second address, wherein the address converter configured to provide the second address based on the received first address and the numerical values stored in the address memory, wherein each respectively received first address is uniquely assigned a respective second address;
    an address bus, which is connected to the output of the address converter, for transferring the second address; and
    an address decoder having an input for receiving the second address, wherein the address decoder is configured to select a respective memory cell to which the second address is assigned.

2. The memory component of claim 1, wherein the numerical values stored in the address memory are the addresses of defective memory cells,
    wherein the address memory is further configured to store an assigned redundant address for each address of defective memory cell, and
    wherein the address converter is configured to provide the second address such that the second address is identical to the first address when the first address is not stored in the address memory, and such that the second address is identical to the assigned redundant address when the first address is identical to one of the addresses of defective memory cells stored in the address memory.

3. The memory component of claim 2, wherein the address converter is configured to form the second address from the first address by replacing one or more bits of the first address.

4. The memory component of claim 1, wherein the numerical values stored in the address memory are addresses of defective memory cells,
    wherein the address memory is further configured to store an assigned address shift value with respect to each address of a defective memory cell,
    wherein the address converter comprises an adder for adding the received first address and the assigned address shift value for the received first address when the first address is stored in the address memory and for outputting a sum at its output, and
    wherein the address converter is configured to provide the second address such that the second address is identical to the first address when the first address is not stored in the address memory.

5. The memory component of claim 2, wherein the address converter further comprises a signal generator for generating a redundancy signal when the first address is identical to an address stored in the address memory, wherein the address bus further comprises a signal line for transferring the redundancy signal, and wherein the address decoder is configured to interpret the second address when the redundancy signal has been received.

6. The memory component of claim 1, wherein the address converter comprises an adder for adding the received first address and an address shift value and for outputting the sum, wherein the address shift value comprises a numerical value representing a number of stored addresses in the address memory having addresses which are not greater than the received first address.

7. The memory component of claim 1, further comprising:
    a plurality of word lines; and
    a plurality of bit lines, wherein each memory cell is arranged at a crossover of a respective word line and a respective bit line, and wherein each memory cell is connected to the respective bit line by activation of the respective word line.

8. The memory component of claim 7, wherein the addresses assigned to the memory cells, the addresses of defective memory cells, the first address and the second address are word line addresses.

9. The memory component of claim 7, wherein the addresses assigned to the memory cells, the addresses of defective memory cells, the first address and the second address are bit line addresses.

10. A method for selecting a memory cell from a plurality of memory cells of a memory component, comprising:
    receiving a first address;
    reading a numerical value from an address memory, in which a plurality of numerical values are stored, wherein the plurality of numerical values are uniquely related to a plurality of addresses of defective memory cells;
    generating a second address based on the first address and the numerical value read from the address memory, wherein each received first address is uniquely assigned a respective second address; and
    selecting the memory cell depending on the second address.

11. The method of claim 10, further comprising:
    transferring the second address via an address bus to an address decoder configured for selecting memory cells.

12. The method of claim 10, wherein each numerical value comprises an assigned redundant address for a respective address of defective memory cell.

13. The method of claim 10, wherein the second address is generated from the first address by replacing one or more bits of the first address.

14. The method of claim 10, wherein the numerical value comprises an assigned address shift value, and wherein the second address is generated by adding the received first address and the assigned address shift value for the received first address.

15. The method of claim 14, wherein the address shift value represents a number of stored addresses in the address memory having addresses which are not greater than the received first address.

16. The method of claim 10, further comprising:
generating a redundancy signal when the received first address is an address of a defective memory cell.

17. A memory component, comprising:
a plurality of memory cells, each memory cell assigned an address;
an address memory for storing numerical values which are uniquely related to addresses of defective memory cells;
an address converter having an input for receiving a first address and an output for outputting a second address, the address converter configured to output the second address based on the received first address and on the numerical values stored in the address memory, wherein each received first address is uniquely assigned a respective second address;
an address bus, which is connected to the output of the address converter, for transferring the second address; and
a plurality of address decoders each having an input for receiving the second address, wherein each address decoder is configured for selecting a memory cell to which the second address is assigned, and wherein each address decoder is connected to one of a plurality of congeneric memory blocks.

18. The memory component of claim 17, wherein the numerical values stored in the address memory are the addresses of defective memory cells,
wherein the address memory is further configured to store an assigned redundant address for each address of defective memory cell, and
wherein the address converter is configured to provide the second address such that the second address is identical to the first address when the first address is not stored in the address memory, and such that the second address is identical to the assigned redundant address when the first address is identical to one of the addresses of defective memory cells stored in the address memory, wherein the address converter is configured to form the second address from the first address by replacing one or more bits of the first address.

19. The memory component of claim 17, wherein the numerical values stored in the address memory are addresses of defective memory cells,
wherein the address memory is further configured to store an assigned address shift value with respect to each address of a defective memory cell,
wherein the address converter comprises an adder for adding the received first address and the assigned address shift value for the received first address when the first address is stored in the address memory and for outputting a sum at its output, and
wherein the address converter is configured to provide the second address such that the second address is identical to the first address when the first address is not stored in the address memory.

20. The memory component of claim 17, wherein the address converter comprises an adder for adding the received first address and an address shift value and for outputting the sum, wherein the address shift value comprises a numerical value representing a number of stored addresses in the address memory having addresses which are not greater than the received first address.

* * * * *